(12) United States Patent
Sun et al.

(10) Patent No.: US 9,768,406 B2
(45) Date of Patent: Sep. 19, 2017

(54) OLED DISPLAY PANEL AND MANUFACTURING METHOD THEREOF, DISPLAY DEVICE AND FILLING METHOD OF FILLING ADHESIVE

(71) Applicant: BOE TECHNOLOGY GROUP CO., LTD., Beijing (CN)

(72) Inventors: Zhongyuan Sun, Beijing (CN); Kaihong Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 49 days.

(21) Appl. No.: 14/429,256

(22) PCT Filed: Jul. 17, 2014

(86) PCT No.: PCT/CN2014/082410
§ 371 (c)(1),
(2) Date: Mar. 18, 2015

(87) PCT Pub. No.: WO2015/055029
PCT Pub. Date: Apr. 23, 2015

(65) Prior Publication Data
US 2016/0035996 A1  Feb. 4, 2016

(30) Foreign Application Priority Data

Oct. 16, 2013  (CN) .......................... 2013 1 0485179

(51) Int. Cl.
*H01L 51/52*  (2006.01)
*H01L 21/77*  (2017.01)
(Continued)

(52) U.S. Cl.
CPC .......... *H01L 51/5246* (2013.01); *H01L 21/77* (2013.01); *H01L 27/3244* (2013.01);
(Continued)

(58) Field of Classification Search
CPC .. H01L 51/5246; H01L 27/3244; H01L 51/52
See application file for complete search history.

(56) References Cited

U.S. PATENT DOCUMENTS

2005/0275792 A1  12/2005  Chen et al.
2008/0296159 A1*  12/2008  Kong ..................... C08G 65/18
                                                   204/600
(Continued)

FOREIGN PATENT DOCUMENTS

CN  1571598 A  1/2005
CN  1913193 A  2/2007
(Continued)

OTHER PUBLICATIONS

Dec. 30, 2015—(CN)—Second Office Action Appn 201310485179.X with English Tran.
(Continued)

*Primary Examiner* — Marc Armand
(74) *Attorney, Agent, or Firm* — Banner & Witcoff, Ltd.

(57) ABSTRACT

An OLED display panel and a manufacturing method thereof, a display device and a filling method of a filling adhesive are provided. The OLED display panel comprises: a first substrate and a second substrate disposed opposite to each other; a first adhesive dam connected with and located between the first substrate and the second substrate, and provided with at least one opening; a second adhesive dam connected with and located between the first substrate and the second substrate, located outside the first adhesive dam, and forming a sealed cell together with the first substrate and the second substrate; an OLED device located on an inner side of the first adhesive dam and on the first substrate; and a filling adhesive filled in the inner side of the first adhesive dam. With the OLED display panel, the adjusting difficulty of production engineering of the OLED display panel can be reduced.

17 Claims, 3 Drawing Sheets

(51) Int. Cl.
  *H01L 27/32* (2006.01)
  *H01L 51/56* (2006.01)
(52) U.S. Cl.
  CPC ........ *H01L 51/525* (2013.01); *H01L 51/5259* (2013.01); *H01L 51/56* (2013.01); *H01L 2227/323* (2013.01); *H01L 2251/533* (2013.01); *H01L 2251/5315* (2013.01)

(56) References Cited

U.S. PATENT DOCUMENTS

| | | | | |
|---|---|---|---|---|
| 2010/0013384 | A1* | 1/2010 | Song | H01L 51/5246 313/504 |
| 2010/0045181 | A1* | 2/2010 | Oh | H01L 51/5246 313/512 |

FOREIGN PATENT DOCUMENTS

| | | |
|---|---|---|
| CN | 101211962 A | 7/2008 |
| CN | 101478305 A | 7/2009 |
| CN | 101867024 A | 10/2010 |
| CN | 103500755 A | 1/2014 |
| CN | 203521418 U | 4/2014 |
| JP | 2002025764 A | 1/2002 |
| KR | 20030043249 A | 6/2003 |

OTHER PUBLICATIONS

Oct. 20, 2014—(CN) International Search Report for PCT/CN2014/082410.

Oct. 20, 2014—(CN) Written Opinion for PCT/CN2014/082410—Eng Trans.

Jul. 28, 2015—(CN) First Office Action Appn 201310485179.X with Eng Tran.

* cited by examiner ved by at least one embodiment of the disclosure
OLED DISPLAY PANEL AND MANUFACTURING METHOD THEREOF, DISPLAY DEVICE AND FILLING METHOD OF FILLING ADHESIVE The application is a U.S. National Phase Entry of International Application No. PCT/CN2014/082410 filed on Jul. 17, 2014, designating the United States of America and claiming priority to Chinese Patent Application No. 201310485179.X filed on Oct. 16, 2013. The present application claims priority to and the benefit of the above-identified applications and the above-identified applications are incorporated by reference herein in their entirety.

TECHNICAL FIELD

At least one embodiment of the present disclosure relates to an OLED display panel and a manufacturing method, a display device and a filling method of a filling adhesive.

BACKGROUND

OLED (Organic Light-Emitting Diode) display panels have the advantages of thinness, lightness, wide viewing angle, active luminescence, continuous and adjustable color of emitted light, low cost, fast response speed, small energy consumption, low driving voltage, wide working-temperature range, simple production engineering, high luminous efficiency, being usable for flexible display and so on, and have been listed as the next generation display technology having excellent development prospects.

Research shows that, water vapor, oxygen gas and similar components in air have a great effect on the lifetime of the OLED device in an OLED display panel, the reason is as follows. When an OLED device is in operation, electrons need to be injected from a cathode, and this requires the work function of the cathode to be as low as possible. However, the cathode is usually made of aluminum, magnesium, calcium or other metallic material, the chemical property of which is relative active, and which is very prone to react with water vapor and oxygen gas permeated therein; furthermore, water vapor and oxygen gas can also react with a hole transport layer and an electron transport layer in the OLED device; and all of these reactions can cause the failure of the OLED device. Therefore, by means of conducting an effective package for an OLED device so that functional layers of the OLED device are fully separated from water vapor, oxygen gas and similar components in air, the lifetime of the OLED device can be prolonged greatly, and thus the service life of the OLED display panel is prolonged.

At present, method for packaging an OLED device mainly includes: desiccant attaching plus UV adhesive coating, surface packaging, glass frit packaging, thin film packaging and so on. Packaging technology in which an adhesive dam and a filling adhesive are used belongs to the surface packaging. The filling adhesive has a higher transparency, so this packaging technology not only can be used for packaging of bottom-emission devices, but also can be used for packaging of top-emission devices, and is one of the packaging methods having excellent development prospects currently.

As shown in FIG. 1 and FIG. 2, an OLED display panel mainly includes a deposition substrate 19, an OLED device 16 located on the deposition substrate 19 and a protective layer 17 covering the OLED device 16, a package substrate 20 located above the deposition substrate 19 and disposed opposite to the deposition substrate 19, an adhesive dam 21 forming a sealed cell together with the deposition substrate 19 and the package substrate 20, and a filling adhesive 18 filled within the sealed cell. The adhesive dam 21 functions as a first barrier for blocking water vapor and oxygen, the filling adhesive 18 functions as a second barrier for blocking water vapor and oxygen, and the protective layer 17 not only has a function of blocking water vapor and oxygen, but also can prevent the filling adhesive 18 from directly contacting the OLED device 16 and thus affecting the operational characteristics of the OLED device 16.

SUMMARY

At least one embodiment of the present disclosure provides an OLED display panel, a manufacturing method of the OLED display panel, a display device and a filling method of a filling adhesive, so as to reduce the adjusting difficulty of the production engineering of the OLED display panel, and improve the production efficiency of products and the product quality.

An organic light-emitting diode (OLED) display panel provided by at least one embodiment of the disclosure comprises: a first substrate and a second substrate disposed opposite to each other; a first adhesive dam connected with and located between the first substrate and the second substrate, and provided with at least one opening; a second adhesive dam connected with and located between the first substrate and the second substrate and located outside the first adhesive dam, and forming a sealed cell together with the first substrate and the second substrate; an OLED device, located on an inner side of the first adhesive dam and on the first substrate; and a filling adhesive filled in the inner side of the first adhesive dam.

At least one embodiment of the disclosure further provides a display device, which comprises the above-mentioned organic light-emitting diode (OLED) display panel.

At least one embodiment of the disclosure further provides a manufacturing method of an organic light-emitting diode (OLED) display panel, and the method comprises: forming an OLED device on a first substrate; forming a first adhesive dam provided with at least one opening, and a second adhesive dam located outside the first adhesive dam, on a second substrate, with a filling adhesive filled in an inner side of the first adhesive dam; aligning the first substrate and the second substrate, so that the OLED device is located on the inner side of the first adhesive dam and the first substrate is respectively connected to the first adhesive dam and the second adhesive dam; and solidifying the first adhesive dam, the second adhesive dam and the filling adhesive.

At least one embodiment of the disclosure further provides a filling method of a filling adhesive, and the method comprises: forming a first adhesive dam provided with at least one opening and a second adhesive dam located outside the first adhesive dam, on a second substrate; and providing a filling adhesive filled in an inner side of the first adhesive dam.

BRIEF DESCRIPTION OF THE DRAWINGS

In order to illustrate the technical solution of the embodiments of the disclosure more clearly, the drawings of the embodiments will be briefly described below; it is obvious that the drawings as described below are only related to some embodiments of the disclosure, but not limitative of the disclosure.

REFERENCE NUMERALS

| 11—first substrate | 12—second substrate |
|---|---|
| 13—first adhesive dam | 14—opening |
| 15—second adhesive dam | 16—OLED device |
| 17—protective layer | 18—filling adhesive |
| 19—deposition substrate | 20—package substrate |
| 21—adhesive dam | |

DETAILED DESCRIPTION

In order to make objects, technical details and advantages of the embodiments of the disclosure apparent, hereinafter, the technical solutions of the embodiments of the disclosure will be described in a clearly and fully understandable way in connection with the drawings related to the embodiments of the disclosure. It is obvious that the described embodiments are just a part but not all of the embodiments of the disclosure. Based on the described embodiments of the disclosure, those skilled in the art can obtain other embodiment(s), without any inventive work, which should be within the scope of the disclosure.

Figure 1:
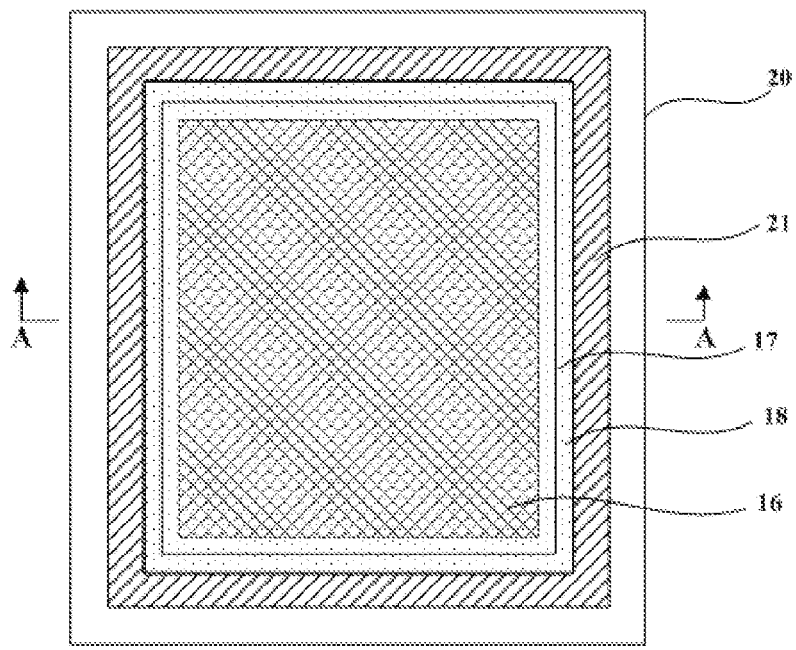
FIG. 1 is a schematic top view illustrating a structure of an OLED display panel.
Figure 2:
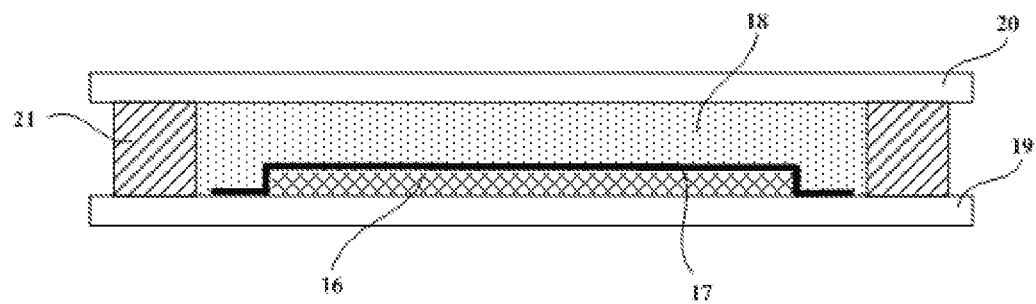
FIG. 2 is a structurally, schematically sectional view taken along a direction A-A in FIG. 1.

The inventor(s) of the present application noted that, in an OLED display panel shown in FIG. 1, a filling adhesive 18 needs to fully fill a sealed cell. If the filling amount is less, a cavity may occur within the sealed cell, and water vapor and oxygen may seep in from the cavity, and thus cause the failure of the OLED device 16. And if the filling amount of the filling adhesive is too much, the adhesive dam 21 can be damaged by overmuch filling adhesive 18, and a protective effect of preventing water vapor and oxygen from penetrating is lost. Therefore, when the filling adhesive 18 is filled, the filling amount of the filling adhesive 18 needs to be controlled accurately. This brings a large adjusting difficulty to the production engineering of the OLED display panel, and affects the production efficiency and the product quality.

In order to reduce the adjusting difficulty of the production engineering of the OLED display panel, and to enhance the production efficiency of products and the product quality, at least one embodiment of the disclosure provides an OLED display panel, a manufacturing method of the OLED display panel, a display device and a filling method of a filling adhesive. In the OLED display panel provided by embodiments of the disclosure, due to the provision of two adhesive dams inside and outside, the filling adhesive only needs to fill up an inner region of the first adhesive dam, and excess filling adhesive may flow out from at least one opening of the first adhesive dam, to fill a gap region between the first adhesive dam and the second adhesive dam. By adopting this design, the filling amount of the filling adhesive may have a larger range of process error. Thus, the adjusting difficulty of production engineering of the OLED display panel is greatly reduced, and this is helpful for enhancing the production efficiency of products and the product quality.

Figure 3:
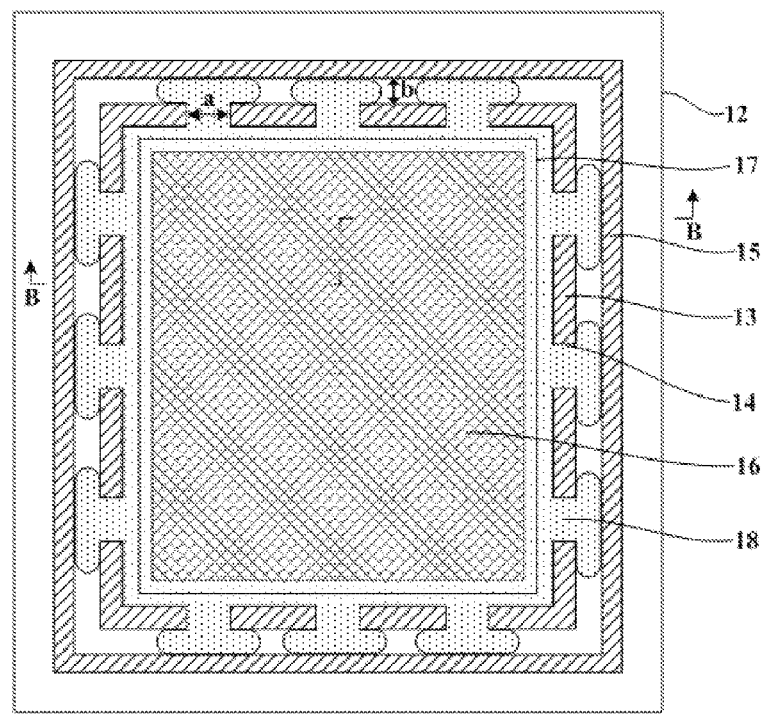
FIG. 3 is a schematic top view illustrating a structure of an OLED display panel according to an embodiment the disclosure.
Figure 4:
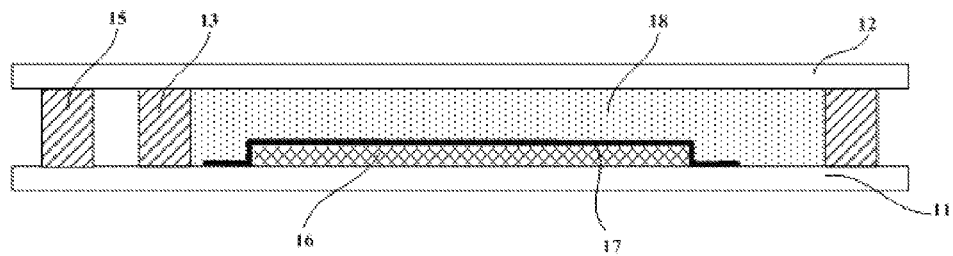
FIG. 4 is a structurally, schematically sectional view taken along a direction B-B in FIG. 3.

As shown in FIG. 3 and FIG. 4, an OLED display panel provided by at least one embodiment of the disclosure includes a first substrate 11 and a second substrate 12 disposed opposite to each other; a first adhesive dam 13 provided with at least one opening 14, connected with and located between the first substrate 11 and the second substrate 12; a second adhesive dam 15, connected with and located between the first substrate 11 and the second substrate 12 and located on an outer side of the first adhesive dam 13, and forming a sealed cell together with the first substrate 11 and the second substrate 12; an OLED device 16, located on an inner side of the first adhesive dam 13 and on the first substrate 11; a protective layer 17, covering the OLED device 16 and hermetically connected to the first substrate 11; and a filling adhesive 18 filled in an inner side of the first adhesive dam 13.

In at least one embodiment of the disclosure, according to the processing technique of the OLED display panel, the first substrate 11 is usually called as an deposition substrate, and the second substrate 12 is usually called as a package substrate. For example, the first adhesive dam 13 and the second adhesive dam 15 may adopt the same constituent (for example, the effective component is epoxy resin) and proportion. For example, the filling adhesive 18 may adopt the same constituent as the first adhesive dam 13 and the second adhesive dam 15, but adopt a different proportion, so that the filling adhesive has a certain flowability when the filling adhesive is filled. All of the first adhesive dam 13, the second adhesive dam 15 and the filling adhesive 18 need to be shaped by a curing process. In various examples, the OLED device 16 may be a top-emission OLED device or a bottom-emission OLED device. Embodiments of the disclosure do not limit the type of the OLED device 16. A material of the protective layer 17 may be silicon nitride and/or silicon oxide and so on, so that a good function of blocking water vapor and oxygen can be obtained.

In the OLED display panel shown in FIG. 1, only a circle of adhesive dam is provided, and a sealed cell is constituted by the adhesive dam and first and second substrates, with a filling adhesive filled in the sealed cell. When the filling adhesive is filled, the filling amount of the filling adhesive needs to be controlled accurately, so as to avoid such a case where the filling amount is inadequate and thus a cavity occurs within the sealed cell, or such a case where the filling amount is too much and thus the adhesive dam is damaged. In embodiments of the disclosure, the filling adhesive 18 only needs to fill up an inner region of the first adhesive dam 13, and excess filling adhesive 18 may flow out from at least one opening 14 of the first adhesive dam 13, to fill a gap region between the first adhesive dam 13 and the second adhesive dam 15. By adopting this design, the filling amount of the filling adhesive 18 may have a larger range of process error (at the very most, it can fill up the gap region between the first adhesive dam 13 and the second adhesive dam 15). Thus, the adjusting difficulty of production engineering of the OLED display panel is greatly reduced, and this is helpful for enhancing the production efficiency of products and the product quality.

In various embodiments, the water permeable rate of the second adhesive dam 15 at normal temperature and pressure may be from 10 to 20 g/m$^2$ per day (g/m$^2$·d), the water permeable rate of the filling adhesive 18 at normal temperature and pressure may be from 5 to 10 g/m$^2$ per day, and the water permeable rate of the protective layer 17 at normal temperature and pressure may be from 10$^{-4}$ g/m$^2$ per day. A sealed cell is formed by the second adhesive dam 15 and the first and second substrates 11 and 12, and the second adhesive dam 15 acts as a first barrier for blocking water vapor and oxygen. The filling adhesive 18 acts as a second barrier for blocking water vapor and oxygen, and the protective layer 17 not only has a function of blocking water vapor and oxygen, but also can prevent the filling adhesive 18 from directly contacting the OLED device 16 and affecting operational characteristics of the OLED device 16. It is seen that, with the structure of embodiments of the disclosure, functional layers of the OLED device can be separated fully from water vapor, oxygen gas and similar component in air, and the lifetime of the OLED device is prolonged greatly. Thus, the service life of the OLED display panel is prolonged.

The specific shapes of the first adhesive dam 13 and the second adhesive dam 15 are not limitative. In at least one embodiment, the OLED display panel is usually a rectangular screen, so the first adhesive dam 13 and the second adhesive dam 15 may take on the shape of a rectangular frame as a whole. As shown in FIG. 3, in an example, the number of the opening 14 is at least two. It is to be noted that, the specific number of the opening 14 can be designed according to the shape and size of the OLED display panel, material properties of adhesive dams and the filling adhesive, etc. In various examples, the at least two openings 14 may be distributed evenly, and the length of each opening 14 may be from 1 millimeter to 2 millimeters. The length of the opening within the selective range enables excess filling adhesive 18 to flow out smoothly, and cannot causing an overlarge impact on the first adhesive dam 13 to damage the first adhesive dam 13. Furthermore, that the length of the opening falls within the selective range can also guarantee that the filling adhesive 18 fully fills in an inner region of the first adhesive dam 13, so as to avoid a filling cavity from occurring in the inner region of the first adhesive dam 13. Thus, this is helpful for improving the product quality.

As shown in FIG. 3, a gap b between the first adhesive dam 13 and the second adhesive dam 15, for example, may be designed according to the precision of a filling device for the filling adhesive and the size of the OLED display panel. It not only helps to reduce the adjusting difficulty of production engineering, but also favors the optimized design of products and further reduction in the production cost, to design the size of the gap between the first adhesive dam 13 and the second adhesive dam 15 according to the precision of a filling device for the filling adhesive and the size of the OLED display panel,.

At least one embodiment of the disclosure provides a display device, and the display device comprises the OLED display panel according to any one of the above-mentioned embodiments. Because the OLED display panel has the above-mentioned effects, the structure of the display device also reduces the adjusting difficulty of production engineering of the display device greatly. This helps to enhance the production efficiency of products and the product quality.

Figure 5:
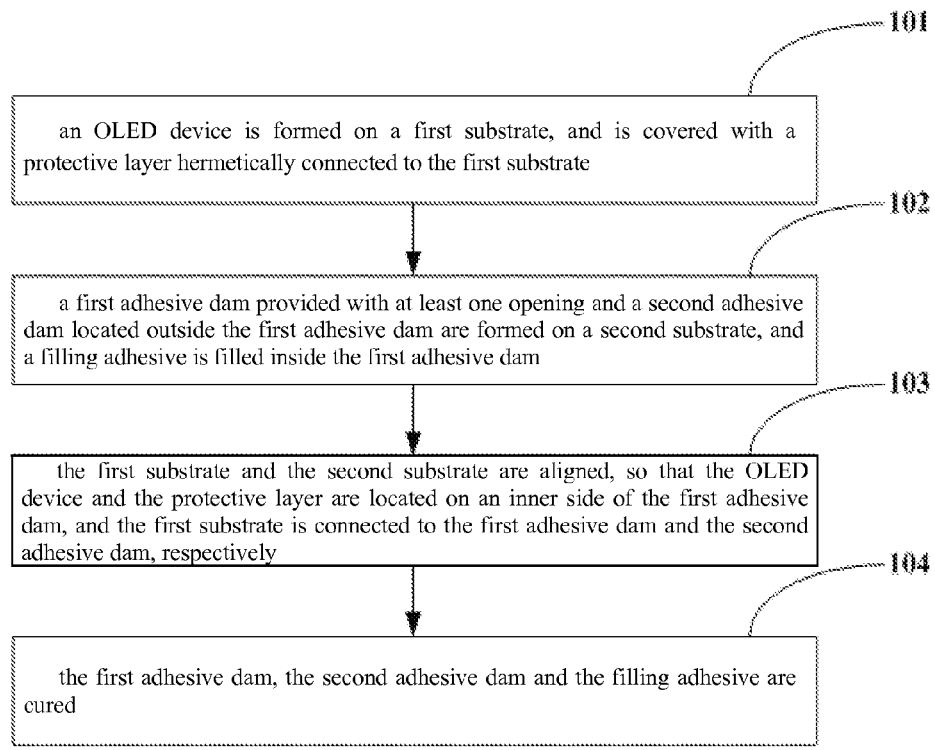
FIG. 5 is a flow chart illustrating a manufacturing method of an OLED display panel according to an embodiment of the disclosure.

In addition, as shown in FIG. 5, at least one embodiment of the disclosure further provides a manufacturing method of an OLED display panel, which comprises the following steps.

Step 101, an OLED device is formed on a first substrate, and is covered with a protective layer hermetically connected to the first substrate.

For example, a vacuum evaporation process may be used to form the OLED device on the first substrate. That is, an evaporated material is heated under a certain vacuum condition, and melted (or sublimated) to form vapor composed of atoms, molecules or atomic groups, and then it accumulates on a surface of a base to form a film, thereby forming a functional layer of the OLED device. The specific process is an existing technology, and details are omitted herein.

For examples, silicon nitride and/or silicon oxide and so on may be chosen as a material of the protective layer. The protective layer may be formed into film by way of chemical vapor deposition.

Step 102, a first adhesive dam provided with at least one opening and a second adhesive dam located outside the first adhesive dam are formed on a second substrate, and a filling adhesive is filled inside the first adhesive dam.

For example, the first adhesive dam and the second adhesive dam may adopt the same constituent (for example, the effective component is epoxy resin) and proportion. For example, the filling adhesive may adopt the same constituent as the first adhesive dam and the second adhesive dam, but adopt a different proportion so that the filling adhesive has a certain flowability when the filling adhesive is filled. Patterns of the first adhesive dam and the second adhesive dam may be directly formed through a coating process, the filling adhesive may be filled in an inner side of the first adhesive dam through a coating process as well, and the filling amount of the filling adhesive may have a larger range of process error.

Step 103, the first substrate and the second substrate are aligned, so that the OLED device and the protective layer are located on an inner side of the first adhesive dam, and the first substrate is connected to the first adhesive dam and the second adhesive dam, respectively.

In this step, a pressing process may be used to connect the first substrate and the first and second adhesive dams. After pressing, the first adhesive dam and the second adhesive dam are contracted under the action of a extrusion force, so that their thicknesses are decreased, while redundant part of the filling adhesive flows out from the opening of the first adhesive dam due to the extrusion force acting on it, and fill a gap region between the first adhesive dam and the second adhesive dam.

Step 104, the first adhesive dam, the second adhesive dam and the filling adhesive are cured. Because the first adhesive dam, the second adhesive dam and the filling adhesive subjected to the step 103 have a certain plasticity, it is necessary for them to be cured. For example, an UV light curing process may be employed.

It is to be noted that, upon manufacture of the OLED display panel, orders of the step 101 and the step 102 can be interchanged, or they are carried out simultaneously. This does not affect the final fabrication and formation of the OLED display panel.

Owing to use of the method, the filling amount of the filling adhesive may have a larger range of process error. Thus, the adjusting difficulty of the production engineering is reduced, and this helps to enhance the production efficiency of products and the product quality.

At least one embodiment of the disclosure further provides a filling method of a filling adhesive. The method comprises: forming a first adhesive dam provided with at least one opening, and a second adhesive dam located outside the first adhesive dam, on a second substrate; and filling a filling adhesive in an inner side of the first adhesive dam.

In an example, the filling method further comprises: placing the first substrate and the second substrate to be opposite to each other, so that the first substrate is connected to the first adhesive dam and the second adhesive dam, respectively; and solidifying the first adhesive dam, the second adhesive dam and the filling adhesive.

The filling method according to embodiments of the disclosure is suitable for such a sealing environment that requires to be filled with a filling adhesive, especially suitable for such a sealing environment that has strict requirements on the filling amount of a filling adhesive, like an OLED display panel. In the filling method according to embodiments of the disclosure, due to the provision of two circles of adhesive dams inside and outside, the filling adhesive only needs to fill up an inner region of the first adhesive dam, and excess filling adhesive may flow out from at least one opening of the first adhesive dam, to fill a gap region between the first adhesive dam and the second adhesive dam. Owing to the adoption of the design, the filling amount of the filling adhesive can have a larger range of process error. Thus, this greatly reduces the adjusting difficulty in filling the filling adhesive.

Apparently, various modifications and variations to the present disclosure can be made by those skilled in the art without departing from the spirit and scope of the disclosure. In this way, if these modifications and variations of the disclosure fall within the scope of the claims of the disclosure and their equivalents, then the present disclosure is intended to cover these modifications and variations.

This application claims the benefit of Chinese Patent Application No. 201310485179.X, filed on Oct. 16, 2013, which is hereby entirely incorporated by reference.

What is claimed is:

1. An organic light-emitting diode (OLED) display panel, comprising:
 a first substrate and a second substrate disposed opposite to each other;
 a first adhesive dam, connected with and located between the first substrate and the second substrate, and provided with at least one opening;
 a second adhesive dam, connected with and located between the first substrate and the second substrate, and located outside the first adhesive dam, wherein the second adhesive dam, the first substrate and the second substrate form a sealed cell;
 an OLED device, located on an inner side of the first adhesive dam and on the first substrate;
 a filling adhesive, filled in the inner side of the first adhesive dam; and
 a protective layer covering the OLED device and hermetically connected to the first substrate.

2. The OLED display panel claimed as claim 1, wherein there are at least two openings in number, the at least two openings are distributed evenly, and a length of each of the openings is from 1 millimeter to 2 millimeters.

3. The OLED display panel claimed as claim 1, wherein a gap between the first adhesive dam and the second adhesive dam is obtained based on precision of a filling device for the filling adhesive and a size of the OLED display panel.

4. The OLED display panel claimed as claim 1, wherein a water permeable rate of the second adhesive dam at normal temperature and pressure is from 10 to 20 $g/m^2$ per day, and a water permeable rate of the filling adhesive at normal temperature and pressure is from 5 to 10 $g/m^2$ per day.

5. The OLED display panel claimed as claim 1, wherein the OLED device comprises a top-emission OLED device or a bottom-emission OLED device.

6. The OLED display panel claimed as claim 1, wherein a water permeable rate of the protective layer at normal temperature and pressure is $10^{-4}$ $g/m^2$ per day.

7. The OLED display panel claimed as claim 1, wherein a material of the protective layer comprises at least one selected from the group consisting of silicon nitride and silicon oxide.

8. A display device, comprising an organic light-emitting diode (OLED) display panel claimed as claim 1.

9. The OLED display panel claimed as claim 2, wherein a gap between the first adhesive dam and the second adhesive dam is obtained based on precision of a filling device for the filling adhesive and a size of the OLED display panel.

10. The OLED display panel claimed as claim 2, wherein a water permeable rate of the second adhesive dam at normal temperature and pressure is from 10 to 20 $g/m^2$ per day, and a water permeable rate of the filling adhesive at normal temperature and pressure is from 5 to 10 $g/m^2$ per day.

11. The OLED display panel claimed as claim 2, wherein the OLED device comprises a top-emission OLED device or a bottom-emission OLED device.

12. The OLED display panel claimed as claim 3, wherein a water permeable rate of the second adhesive dam at normal temperature and pressure is from 10 to 20 $g/m^2$ per day, and a water permeable rate of the filling adhesive at normal temperature and pressure is from 5 to 10 $g/m^2$ per day.

13. The OLED display panel claimed as claim 3, wherein the OLED device comprises a top-emission OLED device or a bottom-emission OLED device.

14. The OLED display panel claimed as claim 4, wherein the OLED device comprises a top-emission OLED device or a bottom-emission OLED device.

15. A manufacturing method of an organic light-emitting diode (OLED) display panel, comprising:
 forming an OLED device on a first substrate;
 forming a first adhesive dam with at least one opening, and a second adhesive dam located outside the first adhesive dam, on a second substrate, with a filling adhesive filled in an inner side of the first adhesive dam;
 aligning the first substrate and the second substrate, wherein the OLED device is located on the inner side of the first adhesive dam, and the first substrate is connected to the first adhesive dam and the second adhesive dam, respectively; and
 solidifying the first adhesive dam, the second adhesive dam and the filling adhesive,
 the manufacturing method further comprising covering the OLED device with a protective layer which is hermetically connected to the first substrate, wherein the protective layer is located on the inner side of the first adhesive dam.

16. A filling method of a filling adhesive, comprising:
 forming a first adhesive dam provided with at least one opening, and a second adhesive dam located outside the first adhesive dam, on a second substrate; and
 providing a filling adhesive filled in an inner side of the first adhesive dam,
 wherein the at least one opening can allow the filling adhesive to communicate between the inner side of the first adhesive dam and an outer side of the first adhesive dam.

17. The filling method of the filling adhesive claimed as claim 16, further comprising:
 opposing a first substrate and the second substrate to each other, so that the first substrate is connected to the first adhesive dam and the second adhesive dam, respectively; and
 solidifying the first adhesive dam, the second adhesive dam and the filling adhesive.

* * * * *